United States Patent
Touya et al.

(10) Patent No.: US 10,998,164 B2
(45) Date of Patent: May 4, 2021

(54) CHARGED PARTICLE BEAM WRITING APPARATUS AND CHARGED PARTICLE BEAM WRITING METHOD

(71) Applicant: NuFlare Technology, Inc., Yokohama (JP)

(72) Inventors: Takanao Touya, Kawasaki (JP); Hirofumi Morita, Setagaya-ku (JP); Munehiro Ogasawara, Hiratsuka (JP)

(73) Assignee: NuFlare Technology, Inc., Yokohama (JP)

( * ) Notice: Subject to any disclaimer, the term of this patent is extended or adjusted under 35 U.S.C. 154(b) by 0 days.

(21) Appl. No.: 16/430,507

(22) Filed: Jun. 4, 2019

(65) Prior Publication Data
US 2019/0371565 A1 Dec. 5, 2019

(30) Foreign Application Priority Data
Jun. 5, 2018 (JP) .............................. JP2018-107945

(51) Int. Cl.
*H01J 37/12* (2006.01)
*H01J 37/30* (2006.01)

(52) U.S. Cl.
CPC .......... *H01J 37/12* (2013.01); *H01J 37/3007* (2013.01); *H01J 2237/12* (2013.01)

(58) Field of Classification Search
USPC .................... 250/396 R, 492.1, 492.2, 492.3
See application file for complete search history.

(56) References Cited

U.S. PATENT DOCUMENTS

| 4,525,629 A | * | 6/1985 | Morita | H01J 29/46 250/396 ML |
| 5,387,799 A | * | 2/1995 | Sohda | H01J 37/3007 250/396 ML |

(Continued)

FOREIGN PATENT DOCUMENTS

| CN | 107104029 A | 8/2017 |
| JP | 61-101944 | 5/1986 |

(Continued)

OTHER PUBLICATIONS

Combined Taiwanese Office Action and Search Report dated May 11, 2020 in corresponding Taiwanese Patent Application No. 108116502 (with English Translation), 16 pages.

(Continued)

*Primary Examiner* — Jason L McCormack
(74) *Attorney, Agent, or Firm* — Oblon, McClelland, Maier & Neustadt, L.L.P.

(57) ABSTRACT

In one embodiment, a charged particle beam writing apparatus includes an emitter emitting a charged particle beam, a first aperture shaping the charged particle beam, a second aperture shaping the charged particle beam transmitted through the first aperture, a projection lens projecting the charged particle beam transmitted through the first aperture on the second aperture, an object lens focusing the charged particle beam transmitted through the second aperture, the object lens being a magnetic field-type lens, and an electrostatic lens performing focus correction of the charged particle beam in accordance with a surface height of a substrate that is a writing target. The electrostatic lens is disposed inside the object lens, a positive voltage is applied to an electrode of the electrostatic lens. A strength of a magnetic field of the object lens at an upper end of the electrode has a predetermined value or less.

11 Claims, 5 Drawing Sheets

(56) References Cited

U.S. PATENT DOCUMENTS

| | | | |
|---|---|---|---|
| 6,201,251 B1 | 3/2001 | Golladay et al. | |
| 6,630,681 B1 | 10/2003 | Kojima | |
| 2012/0049064 A1* | 3/2012 | Ren | H01J 37/145 |
| | | | 250/310 |
| 2013/0214172 A1 | 8/2013 | Touya et al. | |
| 2013/0216953 A1* | 8/2013 | Touya | B82Y 40/00 |
| | | | 430/296 |
| 2015/0155138 A1 | 6/2015 | Yoshikawa et al. | |

FOREIGN PATENT DOCUMENTS

| | | |
|---|---|---|
| JP | 2000-113846 | 4/2000 |
| JP | 2001-093831 | 4/2001 |
| JP | 2005-11967 A | 1/2005 |
| JP | 2013-168589 | 8/2013 |
| JP | 2013-191841 | 9/2013 |
| JP | 2015-109323 | 6/2015 |
| JP | WO 2018/025849 A1 | 2/2018 |
| KR | 10-2013-0094747 A | 8/2013 |
| KR | 10-2014-0144129 A | 12/2014 |
| TW | 201432388 A | 8/2014 |

OTHER PUBLICATIONS

Korean Office Action dated Jul. 3, 2020 in Patent Application No. 10-2019-0061882 (with English translation), 22 pages.
Taiwanese Office Action dated Oct. 15, 2020, in Patent Application No. 108116502 (w/English Machine Translation).
Office Action dated Jan. 11, 2021, in Korean Patent Application No. 10-2019-0061882, w/English Machine Translation.

* cited by examiner

FIG. 5

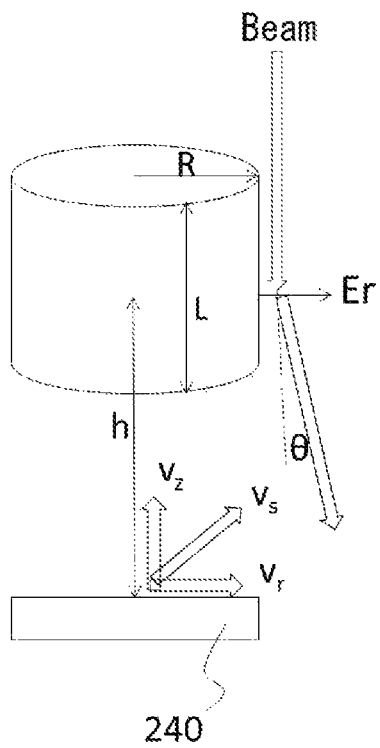

240

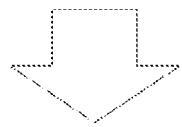

$$Er = \frac{1}{2\pi\varepsilon_0} \times \frac{Q}{RL}$$

$$R = \frac{2mv_r}{eB} \quad \text{(Larmor Radius)}$$

$$\frac{Q}{L} = \frac{I\eta}{v_z} \quad \text{(Z-Direction Charge Density)}$$

$$\frac{1}{2}mv_s^2 = eV_s \quad \text{(Secondary Electron Velocity)}$$

$$\theta = \frac{Er}{2V_0} \times L \quad \text{(Deflection Angle)}$$

$$\Delta pos = \theta \times h \times kl \quad \text{(Position Displacement Amount)}$$

$$\Delta pos = \frac{B \times I \times \eta \times L \times h \times kl}{8\pi\varepsilon_0 \times V_0 \times V_s}$$

CHARGED PARTICLE BEAM WRITING APPARATUS AND CHARGED PARTICLE BEAM WRITING METHOD

CROSS REFERENCE TO RELATED APPLICATION

This application is based upon and claims benefit of priority from the Japanese Patent Application No. 2018-107945, filed on Jun. 5, 2018, the entire contents of which are incorporated herein by reference.

FIELD

The present invention relates to a charged particle beam writing apparatus and a charged particle beam writing method.

BACKGROUND

With an increase in the packing density of LSIs, the required linewidths of circuits included in semiconductor devices become finer year by year. To form a desired circuit pattern on a semiconductor device, a method is employed in which a high-precision original pattern (i.e., a mask, or also particularly called reticle, which is used in a stepper or a scanner) formed on quartz is transferred to a wafer in a reduced manner by using a reduced-projection exposure apparatus. The high-precision original pattern is written by using an electron-beam writing apparatus, in which a so-called electron-beam lithography technique is employed.

In an electron beam writing apparatus, a beam of each shot is focused on a sample surface with an object lens, and focus correction is performed in a dynamic manner (dynamic focusing) by using an electrostatic lens during writing so as to correspond to irregularities of the sample surface. When a minus bias voltage is applied to the electrostatic lens, fogging electrons increase and hinder the improvement of dimensional accuracy of a writing pattern.

To suppress the influence of fogging electrons, it is preferable that a plus bias voltage be applied to the electrostatic lens. However, there is a problem that, when a plus bias voltage is applied to the electrostatic lens, secondary electrons (including reflection electrons) from the sample surface remain on a beam orbit in a high-density manner, change the orbit of an electron beam, and may degrade beam position accuracy.

BRIEF DESCRIPTION OF THE DRAWINGS

FIG. 5 illustrates a method of calculating a beam position displacement amount.

DETAILED DESCRIPTION

In one embodiment, a charged particle beam writing apparatus includes an emitter emitting a charged particle beam, a first aperture shaping the charged particle beam, an illumination lens causing the charged particle beam to illuminate the first aperture, a second aperture shaping the charged particle beam transmitted through the first aperture, a projection lens projecting the charged particle beam transmitted through the first aperture on the second aperture, an object lens focusing the charged particle beam transmitted through the second aperture, the object lens being a magnetic field-type lens, and an electrostatic lens performing focus correction of the charged particle beam in accordance with a surface height of a substrate that is a writing target. The electrostatic lens is disposed inside the object lens, a positive voltage is applied to an electrode of the electrostatic lens. A strength of a magnetic field of the object lens at an upper end of the electrode has a predetermined value or less.

An embodiment of the present invention will be described below on the basis of the drawings.

Figure 1:
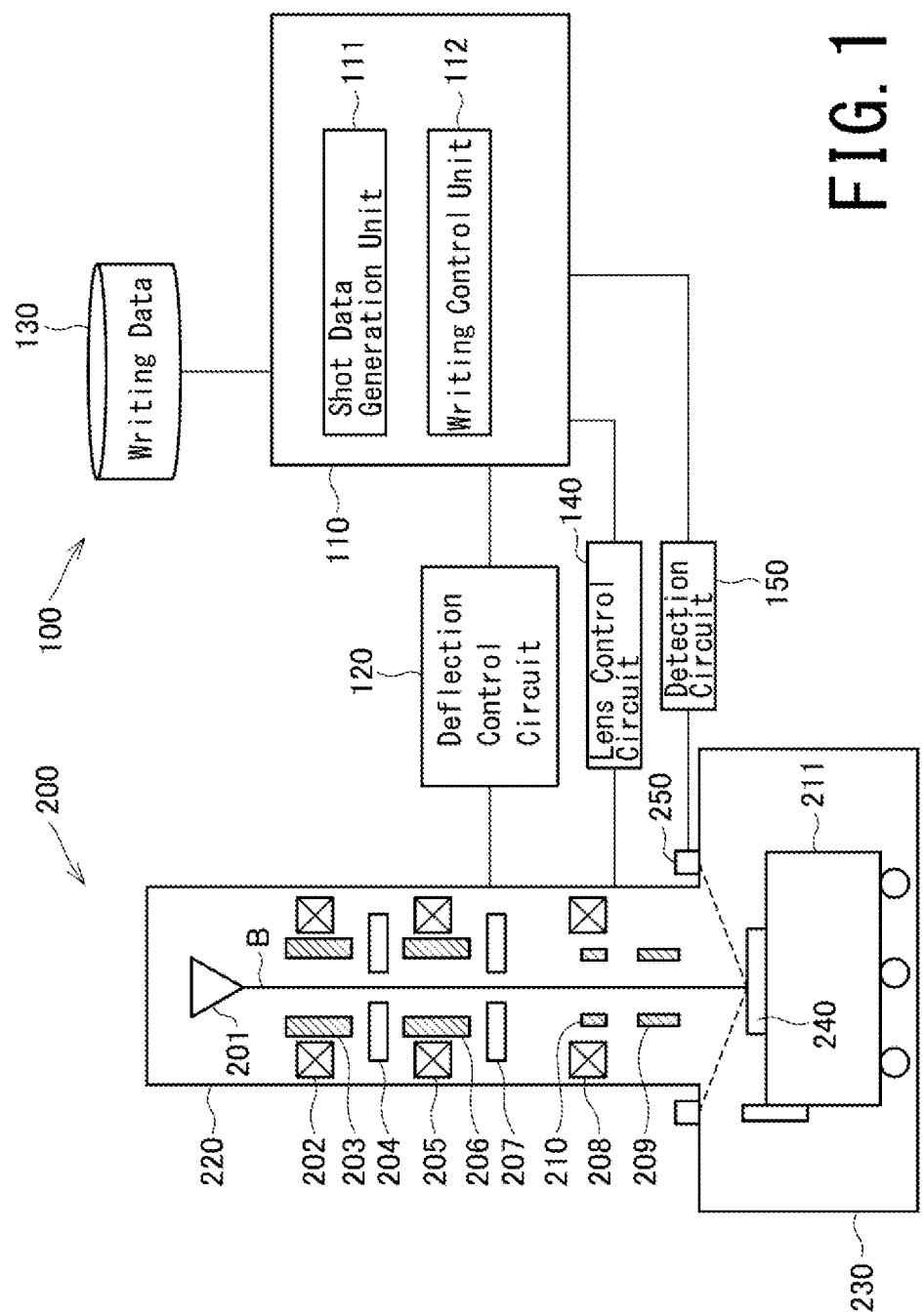
FIG. 1 is a schematic view of an electron beam writing apparatus according to an embodiment of the present invention.

FIG. 1 is a schematic view of an electron beam writing apparatus according to an embodiment of the present invention. The electron beam writing apparatus illustrated in FIG. 1 is a variable-shaping type writing apparatus that includes a control unit 100 and a writing unit 200.

The writing unit 200 includes an electron lens barrel 220 and a writing chamber 230. Inside the electron lens barrel 220, there are disposed an electron gun 201, an illumination lens 202, a blanker 203, a first shaping aperture 204, a projection lens 205, a deflector 206, a second shaping aperture 207, an object lens 208, a deflector 209, and a focus correction lens 210.

Inside the writing chamber 230, an XY stage 211 is disposed. On the XY stage 211, a substrate 240 that is a writing target is placed. At an upper portion of the writing chamber 230, a Z sensor 250 that detects the location of the substrates 240 in a height direction (Z direction) is disposed. The Z sensor 250 is constituted by the combination of a projector and a light receiver and capable of measuring the surface height of the substrate 240 by causing light projected from the projector to be reflected by a surface of the substrate 240 and receiving the reflected light with the light receiver.

Height data detected by the Z sensor 250 is transferred to a control computer 110 after being converted into digital data by a detection circuit 150.

When passing inside the blanker (blanking deflector) 203, an electron beam B emitted from the electron gun 201 (emitter) disposed inside the electron lens barrel 220 is switched by the blanker 203 so as to illuminate the substrate or so as not to illuminate the substrate.

Figure 2:
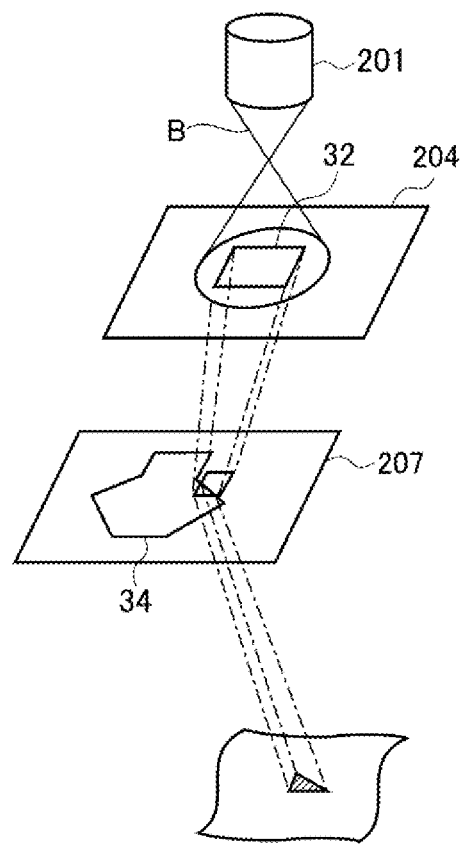
FIG. 2 is a perspective view of a first shaping aperture and a second shaping aperture.

The electron beam B is caused by the illumination lens 202 to illuminate the entirety of the first shaping aperture 204 that has a rectangular opening 32 (refer to FIG. 2). The electron beam B is shaped into a rectangular shape by passing through the opening 32 of the first shaping aperture 204.

The electron beam B of a first aperture image that has passed through the first shaping aperture 204 is projected by the projection lens 205 on the second shaping aperture 207 that has a variable-shaping opening 34 (refer to FIG. 2). At that time, the first aperture image projected on the second shaping aperture 207 is deflection-controlled by the deflector 206, and the shape and dimensions of the electron beam that passes through the variable-shaping opening 34 can be changed (variable shaping is performed).

The electron beam B of a second aperture image that has passed through the variable-shaping opening 34 of the second shaping aperture 207 is focused with the object lens 208 and the focus correction lens 210, and the electron beam B is deflected by the deflector 209 and caused to illuminate the substrate 240 placed on the XY stage 211 that moves continuously.

The deflector 209 is constituted by a plurality of stages of deflectors that differ from each other in terms of size of deflection regions. For example, a two-stage configuration of a primary deflector and a secondary deflector or a three-stage configuration of a primary deflector, a secondary deflector, and a tertiary deflector may be employed.

As the illumination lens 202, the projection lens 205, and the object lens 208, electromagnetic lenses (magnetic field-type lenses) are used. The focus correction lens 210 performs dynamic focus adjustment with respect to height variation of the surface of the substrate 240, and an electrostatic lens is used.

FIG. 2 is a schematic view for describing beam shaping by the first shaping aperture 204 and the second shaping aperture 207. The rectangular opening 32 for shaping the electron beam B is formed in the first shaping aperture 204.

In addition, the variable-shaping opening 34 for shaping the electron beam B that has passed through the opening 32 of the first shaping aperture 204 into a desired shape is formed in the second shaping aperture 207. A beam shape that has passed through both the opening 32 of the first shaping aperture 204 and the variable-shaping opening 34 of the second shaping aperture 207 is irradiated on a writing region of the substrate 240 placed on the XY stage 211 that moves continuously.

As illustrated in FIG. 1, the control unit 100 includes the control computer 110, a deflection control circuit 120, a storage 130, a lens control circuit 140, and the detection circuit 150. Writing data that serves as layout data is input from outside into the storage 130 and stored.

The control computer 110 includes a shot data generation unit 111 and a writing control unit 112. Each of the units of the control computer 110 may be constituted by hardware, such as an electric circuit, or may be constituted by software. When the units are constituted by software, a program that exerts at least part of the function of the control computer 110 may be stored in a recording medium and executed by being read by a computer that includes an electric circuit. The recording medium is not limited to a detachable recording medium, such as a magnetic disk or an optical disk, and may be a fixed-type recording medium, such as a hard disk drive or a memory.

The shot data generation unit 111 retrieves the writing data from the storage 130 and generates shot data by performing a plurality of stages of data conversion processing. The shot data includes information, such as a shot shape, a shot size, a shot position, a shot time, and the like.

The writing control unit 112 transfers the shot data in the order of shots to the deflection control circuit 120. The deflection control circuit 120 controls the deflection amount of each of the blanker 203, the deflector 206, and the deflector 209 by using the shot data and performs writing processing.

The lens control circuit 140 controls each lens disposed at the writing unit 200. For example, the lens control circuit 140 controls the amount of current applied to a coil of the object lens 208. In addition, the lens control circuit 140 controls a voltage applied to the focus correction lens 210 on the basis of the surface height of the substrate 240 detected by the Z sensor 250.

Figure 3:
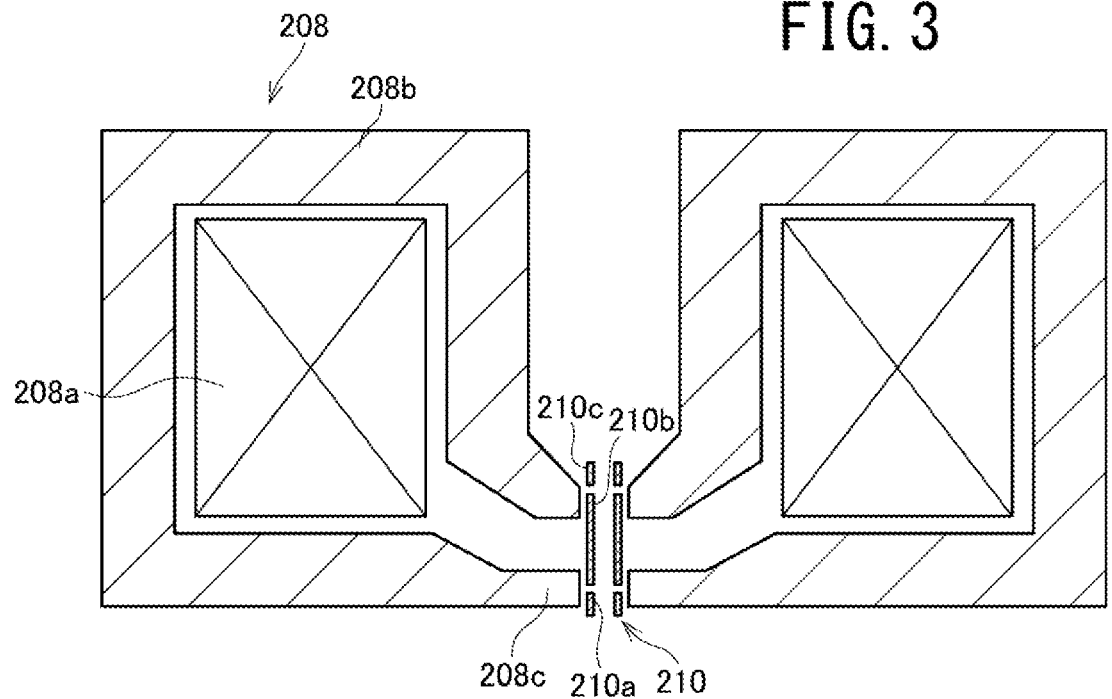
FIG. 3 is a sectional view of an object lens and a focus correction electrostatic lens.

Next, the configuration of the object lens 208 and the focus correction lens 210 will be described. The object lens 208 is an electromagnetic lens and, as illustrated in FIG. 3, includes a coil 208a and a yoke 208b that accommodates the coil 208a. The yoke 208b is constituted by a material, such as iron, having high magnetic permeability and includes a cutout (pole piece 208c) at a portion thereof.

A magnetic line of force (a magnetic force line) produced by causing current to flow through the coil 208a leaks via the pole piece 208c to a space, and a magnetic field is produced.

The focus correction lens 210 is disposed inside the object lens 208 so as to, for example, correspond to the height of the pole piece 208c. The focus correction lens 210 is an electrostatic lens and includes ring-shaped three-stage electrodes 210a, 210b, and 210c. A voltage of 0 V is applied to the electrodes 210a and 210c at upper and lower stages, a positive voltage is applied to the electrode 210b at an intermediate stage, and the focus correction lens 210 is operated with a plus bias.

Secondary electrons (including reflection electrons that hit and are reflected by the substrate 240) generated when an electron beam is caused to illuminate the substrate 240 and enters the substrate 240 travel upward in the electron lens barrel 220. The secondary electrons perform screw motion in the magnetic field of the object lens 208. The orbital radius of the secondary electrons is small in a region in which the magnetic field is strong and large in a region in which the magnetic field is weak.

When the secondary electrons travel in the electrode 210b of the focus correction lens 210, the velocity thereof increases due to the influence of the voltage applied to the electrode 210b. After passing through the electrode 210b, the secondary electrons decelerate, and the velocity decreases.

Even when the orbital radius of the secondary electrons is small, if the velocity thereof is large, the density of the secondary electrons decreases, and the influence of the electron beam output from the electron gun 201 with respect to the orbit is small. In addition, even when the velocity of the secondary electrons is small, if the orbital radius thereof is large, the density of the secondary electrons decreases, and the influence of the electron beam output from the electron gun 201 with respect to the orbit is small.

Meanwhile, when the orbital radius of the secondary electrons is small and when the velocity thereof is small, the density of the secondary electrons increases, which changes the orbit of the electron beam output from the electron gun 201 and may degrade beam position accuracy. That is, when the magnetic field in a region after passing through the electrode 210b is strong, beam position accuracy may be degraded.

Figure 4:
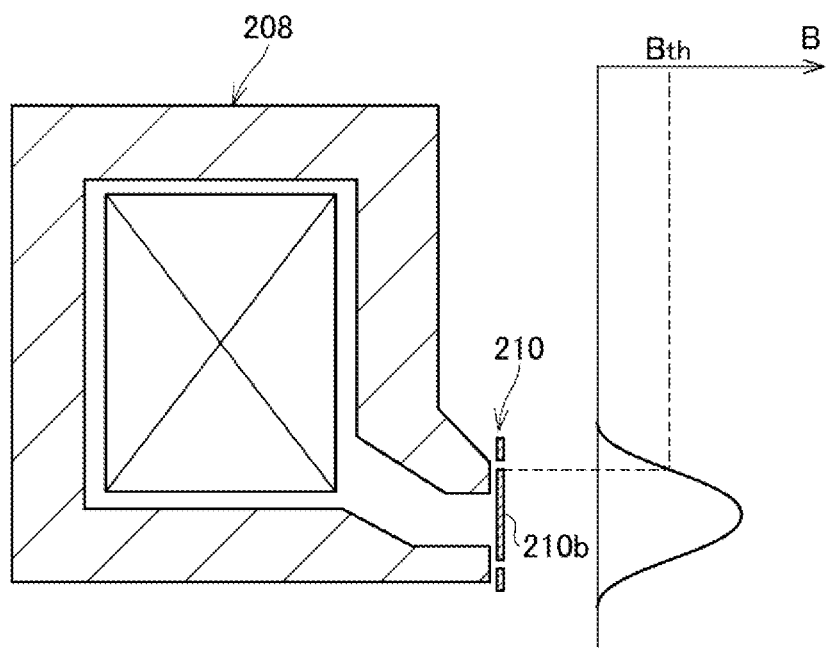
FIG. 4 illustrates magnetic field distribution of the object lens and the location of the focus correction electrostatic lens.

Thus, in the present embodiment, as illustrated in FIG. 4, a configuration in which an upper end of the electrode 210b of the focus correction lens 210 is located in a region in which the strength of the magnetic field (magnetic field on an axis) has a predetermined value Bth or less is employed. Consequently, in a region in which the magnetic field is strong and the orbital radius of the secondary electrons is small, the velocity of the secondary electrons is large and the density of the secondary electrons decreases. In a region in which the secondary electrons have a decreased velocity after passing through the electrode 210b, the magnetic field is weak and the orbital radius of the secondary electrons increases, and the density of the secondary electrons decreases.

A region in which the density of the secondary electrons is high is prevented from being generated, and it is thus possible to prevent beam position accuracy from being degraded. Moreover, due to the focus correction lens 210 being operated with a plus bias, it is possible to suppress the influence of fogging electrons.

The magnetic field strength (predetermined value) Bth is set such that the position displacement amount of a beam illumination position has a predetermined value or less. A position displacement amount Δpos of the beam illumination position is obtained by the formula presented in FIG. 5. In FIG. 5, $\varepsilon_0$ is a dielectric constant in vacuum, Q is a charge amount in a region, m is a mass of electrons, $v_r$ is a radial velocity of the secondary electrons, $v_z$ is a z-direction velocity of the secondary electrons, L is a length of a deceleration region, and h is a height of the deceleration region from the surface of the substrate 240. In addition, kl is a reduction rate of the object lens 208, e is an electronic element amount, I is a beam current, $V_0$ is a beam energy, η is a reflection efficiency, and Vs is a secondary electron energy. The outgoing angle of the secondary electrons is set to 45°.

Figure 6:
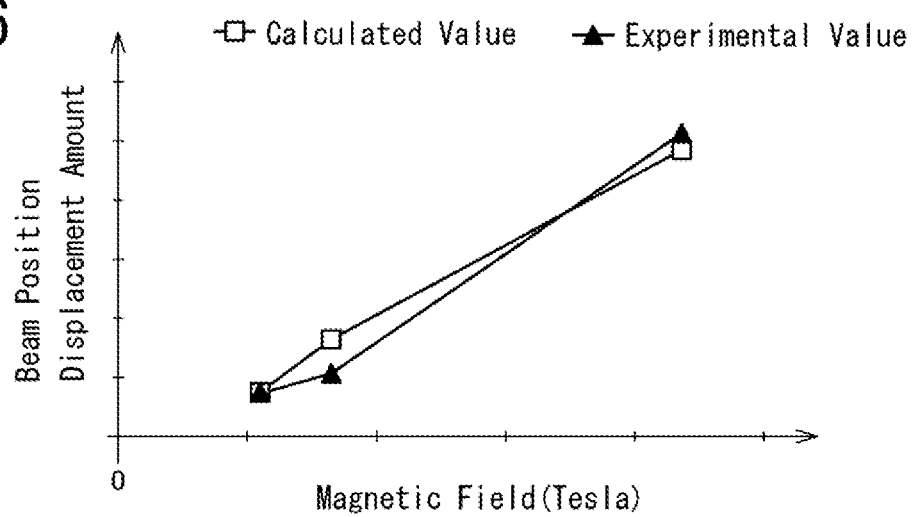
FIG. 6 is a graph illustrating the relationship between the strength of a magnetic field at a leading end of an electrode of the focus correction electrostatic lens and the beam position displacement amount.

FIG. 6 illustrates position displacement amounts obtained by the formula and experimental values of the position displacement amounts. FIG. 6 shows that the formula and the trend of the experimental values substantially coincidence with each other.

When estimating indefinite parameters from the experimental values, the position displacement amount Δpos can be obtained by the formula below. C is a proportionality constant.

$$\Delta pos = C \times B \times I \times h / V_0$$

From this formula, when, for example, proportionality constant C=100000 and if the beam current I is 1 μA, height h=10 mm, and the beam energy $V_0$ is 50 keV, the predetermined value Bth is calculated to be less than 0.05 T (tesla) to make the position displacement amount Δpos be less than 1 nm. That is, due to the electrode 210b of the electrostatic lens (focus correction lens) 210 extending to be present in a region in which the strength of the magnetic field is less than 0.05 T, it is possible to make the position displacement amount of the beam illumination position be less than 1 nm. In other words, it is possible to make the position displacement amount of the beam illumination position be less than 1 nm by adjusting current supplied to the coil of the object lens 208 such that the strength of the magnetic field at the location of the upper end of the electrode 210b of the focus correction lens 210 is less than 0.05 T.

In the aforementioned embodiment, a configuration in which a lower end of the electrode 210b of the focus correction lens 210 is also located in a region in which the strength of the magnetic field has the predetermined value Bth or less is preferably employed. That is, the electrode 210b preferably extends to be present in the entirety of a region in which the strength of the magnetic field has a value larger than the predetermined value Bth. A portion in which the strength of the magnetic field of the object lens 208 is the strongest is present between the upper end and the lower end of the electrode 210b.

In the aforementioned embodiment, a configuration in which an electron beam is used as an example of a charged particle beam has been described; however, the charged particle beam is not limited to an electron beam and may be a beam that uses charged particles, such as an ion beam.

The aforementioned embodiment, for which the writing apparatus has been described as an example, is also applicable to an inspection apparatus that uses a charged particle beam.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A charged particle beam writing apparatus comprising:
an emitter emitting a charged particle beam;
a first aperture shaping the charged particle beam;
an illumination lens causing the charged particle beam to illuminate the first aperture;
a second aperture shaping the charged particle beam transmitted through the first aperture;
a projection lens projecting the charged particle beam transmitted through the first aperture on the second aperture;
an object lens focusing the charged particle beam transmitted through the second aperture, the object lens being a magnetic field-type lens; and
an electrostatic lens performing focus correction of the charged particle beam in accordance with a surface height of a substrate that is a writing target,
wherein the electrostatic lens is disposed inside the object lens, a positive voltage is applied to an electrode of the electrostatic lens, a strength of a magnetic field of the object lens at an upper end of the electrode has a predetermined value or less, and a portion in which the strength of the magnetic field of the object lens has a peak value is below the upper end of the electrode.

2. The apparatus according to claim 1, wherein at least a portion of the electrode extends to be present in a region in which the strength of the magnetic field of the object lens has a value larger than the predetermined value.

3. The apparatus according to claim 2, wherein the strength of the magnetic field of the object lens at a lower end of the electrode has the predetermined value or less.

4. The apparatus according to claim 3, wherein the electrode extends to be present in entirety of a region in which the strength of the magnetic field of the object lens has a value larger than the predetermined value.

5. The apparatus according to claim 1, wherein the electrostatic lens includes three stages of electrodes of an upper-stage electrode, an intermediate-stage electrode, and a lower-stage electrode, a voltage of 0 V is applied to the upper-stage electrode and the lower-stage electrode, and the positive voltage is applied to the intermediate-stage electrode.

6. The apparatus according to claim 5, wherein the intermediate-stage electrode extends to be present in entirety of a region in which the strength of the magnetic field of the object lens has a value larger than the predetermined value.

7. The apparatus according to claim 1,
wherein the object lens includes a coil and a yoke that accommodates the coil,
wherein the yoke includes a cutout, and
wherein the electrostatic lens is disposed at a height of the cutout.

8. A charged particle beam writing method comprising:
emitting a charged particle beam;
focusing the charged particle beam by using an object lens that is a magnetic field-type lens, and forming a pattern by causing the charged particle beam to illuminate a substrate that is a writing target; and performing focus correction of the charged particle beam in accordance with a surface height of the substrate by using an electrostatic lens disposed inside the object lens, wherein a positive voltage is applied to an electrode of the electrostatic lens, and wherein current is supplied to a coil of the object lens such that a strength of a magnetic field of the object lens at an upper end of the electrode has a predetermined value or less, and a portion in which the strength of the magnetic field of the object lens has a peak value is below the upper end of the electrode.

9. The method according to claim 8, wherein current is supplied to the coil of the object lens such that the strength of the magnetic field of the object lens at a lower end of the electrode has a predetermined value or less.

10. The method according to claim 9, wherein a portion in which the strength of the magnetic field of the object lens has a maximum value is present at a height between the upper end and the lower end of the electrode.

11. The method according to claim 8, wherein the electrostatic lens includes three stages of electrodes of an upper-stage electrode, an intermediate-stage electrode, and a lower-stage electrode, and wherein a voltage of 0 V is applied to the upper-stage electrode and the lower-stage electrode, and the positive voltage is applied to the intermediate-stage electrode.

* * * * *